United States Patent
Jo et al.

(10) Patent No.: US 9,040,990 B2
(45) Date of Patent: May 26, 2015

(54) ARRAY SUBSTRATE FOR FLAT DISPLAY DEVICE AND METHOD OF FABRICATING THE SAME

(71) Applicant: LG DISPLAY CO., LTD., Seoul (KR)

(72) Inventors: Chel-Hee Jo, Daejeon (KR); Dae-Sung Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/683,913

(22) Filed: Nov. 21, 2012

(65) Prior Publication Data

US 2013/0161626 A1 Jun. 27, 2013

(30) Foreign Application Priority Data

Dec. 26, 2011 (KR) .................. 10-2011-0142667

(51) Int. Cl.
  H01L 27/15 (2006.01)
  H01L 33/00 (2010.01)
  H01L 27/12 (2006.01)

(52) U.S. Cl.
  CPC ............ H01L 27/156 (2013.01); H01L 33/005 (2013.01); H01L 27/124 (2013.01)

(58) Field of Classification Search
  CPC .......................... H01L 27/156; H01L 27/3276
  USPC ................................................... 257/59, 72
  See application file for complete search history.

(56) References Cited

U.S. PATENT DOCUMENTS

| 8,289,457 | B2* | 10/2012 | Hwang et al. ............ 349/12 |
| 2004/0165120 | A1 | 8/2004 | Woo et al. |
| 2005/0165120 | A1* | 7/2005 | Kumar et al. ............ 516/78 |
| 2008/0158745 | A1* | 7/2008 | Chen et al. ............ 361/56 |
| 2008/0316189 | A1* | 12/2008 | Choi et al. ............ 345/204 |

FOREIGN PATENT DOCUMENTS

| CN | 1991551 A | 7/2007 |
| CN | 102053434 A | 5/2011 |
| TW | 200828232 A | 7/2008 |

OTHER PUBLICATIONS

State Intellectual Property Office of the People's Republic of China, First Office Action, Chinese Patent Application No. 201210272763. 2, Dec. 26, 2014, fourteen pages.

* cited by examiner

Primary Examiner — Tran Tran
(74) Attorney, Agent, or Firm — Fenwick & West LLP

(57) ABSTRACT

Embodiments relate to an array substrate for a flat display device and a method of fabricating the same for reducing an over etch at a portion of the substrate where a data line is applied in a diagonal shape during the etching of the data line. As a result, disconnection of the data line may be reduced, which in turn reduces the failure rate of the flat display devices and enhances process yield.

9 Claims, 6 Drawing Sheets

ARRAY SUBSTRATE FOR FLAT DISPLAY DEVICE AND METHOD OF FABRICATING THE SAME

CROSS-REFERENCE TO RELATED APPLICATION

This application claims priority to Republic of Korea Patent Application No. 10-2011-0142667, filed on Dec. 26, 2011, which is incorporated by reference herein in its entirety.

BACKGROUND

1. Field of the Invention

The present invention relates to an array substrate for a flat display device and a method of fabricating the same.

2. Description of the Related Art

With the development of information society, the requirements of display devices for displaying an image have increased in various forms, and in recent years, various flat display devices have been used such as a liquid crystal display (LCD), a plasma display panel (PDP), an organic light emitting diode (OLED), an electrophoretic display device (EPD), and the like.

For example, an electrophoretic display device has features such as no external light source, excellent flexibility and portability, light weight, and the like.

Such an electrophoretic display device is a reflective type display in which a thin-film transistor array substrate is formed on a thin and flexible base film such as paper or plastic and a transparent conductive layer is coated to drive suspended electrophoretic particles, and expected to be widely used as a next-generation electronic paper.

FIG. 1 is a view illustrating an electrophoretic display device in the related art, and FIG. 2 is an enlarged view illustrating a portion "A" of FIG. 1.

Referring to FIG. 1, an array substrate of the electrophoretic display device may include a data pad portion 20 and a gate pad portion 30 located at an edge region of the substrate 10, namely, non-display region. Furthermore, a plurality of data lines formed on the display region are linked to the data pad portion 20, and a plurality of gate lines formed on the display region are linked to the gate pad portion 30. A plurality of gate pads (not shown) and data pads (not shown) are formed on the gate pad portion 30 and data pad portion 20 and linked to the gate lines and data lines one to one. In the display region, a plurality of gate lines 35 and a plurality of data lines 25 are vertically crossed with each other to define a plurality of unit pixels (P's).

Gate and data signals from a driving circuit unit (not shown) are applied to each pixel of the display region. FIG. 2 is an enlarged view illustrating a portion "A" of FIG. 1, and schematically illustrates a link portion of the non-display region. In particular, FIG. 2 illustrates data link lines 22_1 to 22_3 of the non-display region for applying data signals from the driving circuit unit (not shown) to each pixel (P). In this case, an electrostatic discharge protection circuit (not shown) may be further provided between the unit pixel (P) and data link lines 22_1 to 22_3.

Furthermore, the data link lines 22_1 to 22_3 from the driving circuit unit are arranged in parallel with one another in the non-display region, wherein each data link line is bent in the vertical direction (that is, bent at 90° with respect to a portion thereof extending from the driving circuit unit) and linked to the corresponding data line to enter the display region.

A current technological trend is aimed at decreasing the bezel to increase a visual sense of beauty, and thus the development of displays with a narrow bezel have been carried out. Displays with a narrow bezel have a narrow non-display region and thus the gaps between the data link lines disposed in the non-display region as well as the line width of the data link lines may be decreased, thereby increasing resistance to cause a problem of signal delay. If the delay of a signal applied to the data link lines is significantly increased due to the resistance of the data link lines, then a ghost phenomenon may occur in which the previous image remains while the current image is updated to the next image.

SUMMARY

An array substrate for a flat display device and a method of fabricating the same is capable of alleviating a signal delay problem that arises due to the reduction of a line width of link lines, even in displays with a narrow bezel.

Other objects and features of the present invention will become apparent from the following description and claims.

In order to accomplish the foregoing object, an array substrate for a flat display device according to an embodiment of the present invention may include a substrate comprising a display region and a non-display region disposed at an edge of the display region, a plurality of gate lines disposed in the display region and a plurality of data lines vertically crossed with the plurality of gate lines, and a plurality of gate link lines and a plurality of data link lines configured to apply gate signals and data signals to the plurality of gate lines and the plurality of data lines, respectively, wherein at least the outermost data link line of the plurality of data link lines comprises an end portion, the end portion is connected in a diagonal shape to a corresponding data line of the plurality of data lines, and wherein the outermost data link line is the data link line closest to the outermost edge of the non-display region.

The array substrate for a flat display device may be characterized in that the end portion includes a horizontal portion extending from the corresponding data line, a vertical portion perpendicular to the corresponding data line, and a diagonal portion having a diagonal shape connected between the horizontal portion and vertical portion.

Alternatively, the array substrate for a flat display device may be characterized in that the end portion comprises a vertical portion perpendicular to the corresponding data line and a diagonal portion having a diagonal shape connected between the corresponding data line and the vertical portion. Alternatively, the end portion may further include a parallel portion coming out of the data line at a portion connected between the diagonal portion and data line.

The array substrate for a flat display device may be characterized in that each of the plurality of data link lines comprises the end portion, and a gap between the diagonal portions have a same width as a width of a gap between the vertical portions.

The array substrate for a flat display device may be characterized in that a line width of the diagonal portion is same as a line width of the vertical portion.

The array substrate for a flat display device may be characterized in that a line width of the diagonal portion is greater than a line width of the vertical portion.

The array substrate for a flat display device may be characterized in that a gap between the diagonal portions has a same width as a width of a gap between the vertical portions.

The array substrate for a flat display device may be characterized in that a gap between the diagonal portions is greater than a width of a gap between the vertical portions in the plurality of data link lines.

The array substrate for a flat display device may include a gate electrode formed on the substrate, a gate insulating layer formed on the gate electrode, a semiconductor layer formed on the gate insulating layer, a source electrode and a drain electrode formed on the semiconductor layer, and a pixel electrode brought into contact with the drain electrode.

The flat display device may be an electrophoretic display device.

The flat display device may be a liquid crystal display device.

The array substrate for a flat display device may be characterized in that an electrostatic discharge protection circuit is provided between the plurality of data link lines and the plurality of data lines.

A method of fabricating an array substrate for a flat display device according to an embodiment of the present invention may include: providing a substrate comprising a display region and a non-display region disposed at an edge of the display region; forming a plurality of gate lines and a plurality of gate electrodes in the display region, and a plurality of gate link lines for providing gate signals to the plurality of gate lines in the non-display region; forming a gate insulating layer on an entire surface of the substrate formed with the plurality of gate lines, the plurality of gate electrodes, and the plurality of gate link lines; forming a semiconductor layer on the gate insulating layer; forming a conductive layer on the substrate formed with the semiconductor layer; patterning the conductive layer to form a plurality of data lines, a plurality of source electrodes and a plurality of drain electrodes in the display region, and a plurality of data link lines for providing data signals to the plurality of data lines in the non-display region; and forming a passivation layer on the substrate formed with the plurality of data lines and the plurality of data link lines, and forming a plurality of pixel electrodes electrically connected to the plurality of drain electrodes on the passivation layer respectively, wherein at least the outermost data link line comprises an end portion, the end portion is connected in a diagonal shape to a corresponding data line, and the outermost data link line is the data link line closest to the outermost edge of the non-display region.

The method may be characterized in that the end portion comprises a horizontal portion extending from the corresponding data line, a vertical portion perpendicular to the corresponding data line, and a diagonal portion having a diagonal shape connected between the horizontal portion and vertical portion.

Alternatively, the method may be characterized in that the end portion comprises a vertical portion perpendicular to the corresponding data line and a diagonal portion having a diagonal shape connected between the corresponding data line and vertical portion.

The method may be characterized in that each of the plurality of data link lines comprises the end portion, and a gap between the diagonal portions has a same width as a width of a gap between the vertical portions.

The method may be characterized in that a line width of the diagonal portion is same as a line width of the vertical portion.

The method may be characterized in that a line width of the diagonal portion is greater than a line width of the vertical portion.

The method may be characterized in that the diagonal portion is exposed to more etchant than to the vertical portion during the step of patterning the conductive layer.

The method may be characterized in that a gap between the diagonal portions have a same width as a width of a gap between the vertical portions. The diagonal portion may be exposed to same etchant amount as to the vertical portion during the step of patterning the conductive layer.

The method may be characterized in that a gap between the diagonal portions is greater than a gap between the vertical portions in the plurality of data link lines.

The method may be characterized in that the flat display device is an electrophoretic display device.

The method may be characterized in that the flat display device is a liquid crystal display device.

As described above, according to the present embodiment, when a drive signal generated from the driving circuit unit is provided to the screen display unit through a link line, the path may be reduced, thereby preventing signal delay. Furthermore, a line width of the wiring may be designed in an expanded manner to solve an over etch problem that is caused by allowing a diagonal portion provided to prevent signal delay to be exposed to more etchant during a wet etching process, and thus it may be possible to prevent a disconnection thereof and achieve a uniform line width subsequent to the wet etching process, thereby providing an effect of preventing signal delay.

In addition, according to the present embodiment, a disconnection of the data link line may be reduced to reduce the failure rate of a flat display panel, thereby providing an effect of enhancing process yield.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF EMBODIMENTS

Hereinafter, according to a preferred embodiment of the present invention, an array substrate for a flat display, and a method of fabricating the same will be described in detail with reference to the accompanying drawings.

Figure 1:
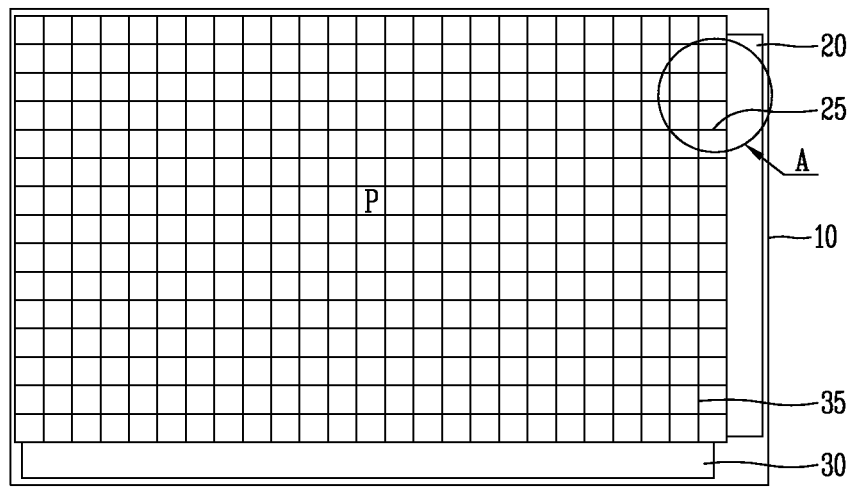
FIG. 1 is a view illustrating an electrophoretic display device in the related art.
Figure 2:
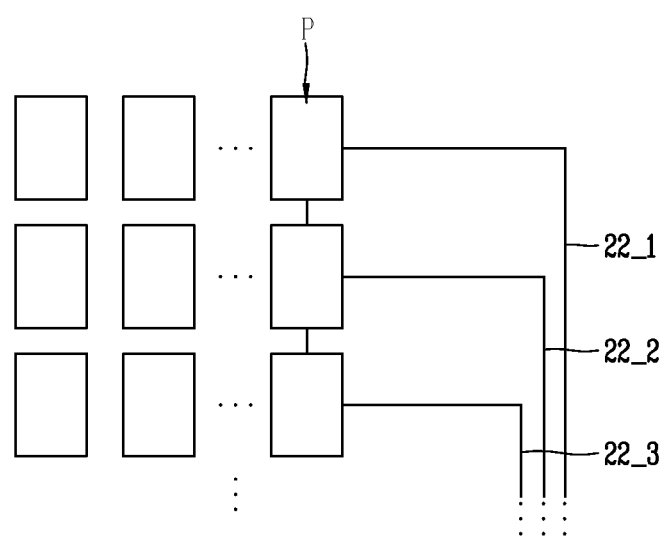
FIG. 2 is an enlarged view illustrating a portion "A" of FIG. 1.
Figure 3:
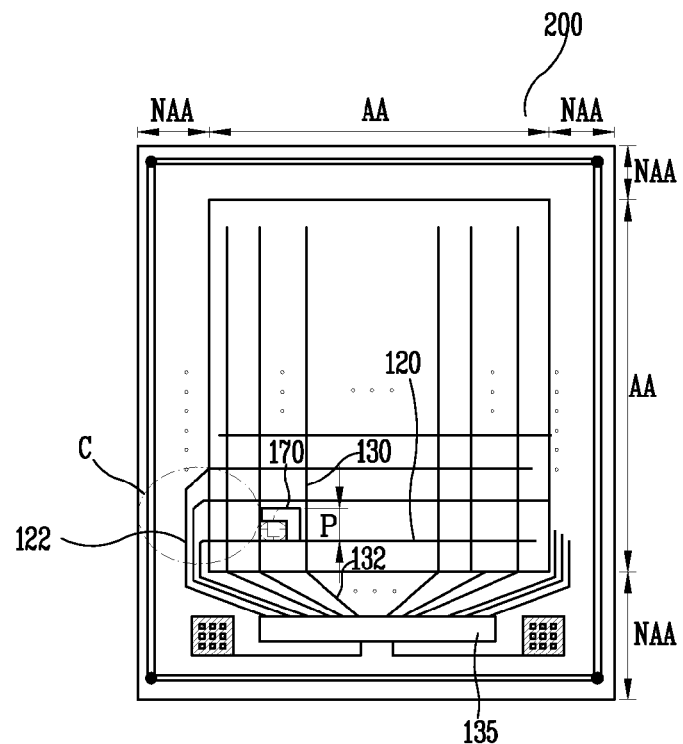
FIG. 3 is a plan view illustrating a flat display device according to one embodiment.

FIG. 3 is a plan view illustrating a flat display device according to one embodiment.

Referring to FIG. 3, an array substrate for a flat display device 200 according to the present invention may include a display region (AA) for implementing an image, and a non-display region (NAA) disposed at one or more edges of the display region (AA).

The array substrate 200 for a flat display may be formed with a plurality of gate lines 130 on a base substrate such as glass or the like configured to receive gate signals, and a plurality of data lines 120 vertically crossed with the plurality of gate lines 130. A plurality of pixel regions (P's) are defined at the intersection of the gate lines and data lines. A thin-film transistor which is a switching element may be formed at each pixel region, and a pixel electrode 170 to which an image signal is provided while being controlled by the thin-film transistor may be formed at each pixel.

Furthermore, a plurality of gate link lines 132 and data link lines 122 for providing drive signals generated from a driving circuit unit 135 to a plurality of gate lines 130 and a plurality of data lines 120 are configured in the non-display region (NAA) of the array substrate 200 for a flat display. In this case, the driving circuit unit 135 may include a gate drive IC (not shown) and a data drive IC (not shown) for driving the plurality of gate lines 130 and plurality of data lines 120, respectively. Accordingly, gate link lines and data link lines are disposed between the driving circuit unit 135 and the gate lines and data lines.

An electrostatic discharge protection circuit (not shown) may be further provided between the gate line and gate link line and between the data line and data link line to prevent the induction of electrostatic discharge generated from the outside.

Furthermore, from the perspective of an equivalent circuit, the array substrate 200 for a flat display may include a plurality of gate lines and data lines 130, 120, and a plurality of unit pixels connected to those lines and arranged in a matrix form.

Each unit pixel may include a switching element connected to the gate line and data line 120, 130, and a storage capacitor connected to the switching element. The switching element is provided on the array substrate, and as a three-terminal element, the control terminal and providing terminal are connected to the gate line 130 and data line 120, respectively, and the output terminal is connected to the storage capacitor. For example, the switching element may be a Thin Film Transistor (TFT), the gate electrode of the TFT is the control terminal, the source electrode of the TFT is the providing terminal, and the drain electrode of the TFT is the output terminal.

The pixel electrode is connected to the switching element (T) and the common electrode is formed at an entire surface of the color filter substrate to receive a common voltage (Vcom). Here, the common electrode may be also provided on the array substrate, and in this case, both two electrodes are made of a linear- or rod-shaped electrode.

The storage capacitor (not shown) is formed by overlapping a separate signal line (not shown) provided on the array substrate with the pixel electrode, and a predetermined voltage such as a common voltage or the like is applied to the separate signal line. Alternatively, the storage capacitor may be also formed by overlapping the pixel electrode with a gate line directly on the pixel electrode by interposing a dielectric substance.

Meanwhile, each unit pixel should display color to implement a color scheme, which is enabled by providing red, green and blue color filters in a region corresponding to the pixel electrode. Here, the color filters may be formed in the relevant region of the color filter substrate, and also formed over or under the pixel electrode of the array substrate.

A polarizer (not shown) for polarizing light may be adhered to at least one outer surface of the array substrate and color filter substrate.

Here, though not shown in the drawing, the array substrate 200 for a flat display may include a timing controller for controlling the driving circuit unit 135.

The timing controller arranges image data provided from the outside in a suitable manner to drive the flat display panel and supplies the arranged data to the driving circuit unit 135. Furthermore, the timing controller generates gate and data control signals using a dot clock (DLCK), a data enable signal (DE), and horizontal and vertical synchronization signals (Hsync, Vsync) provided from the outside to control a drive timing of the driving circuit unit 135.

Figure 4:
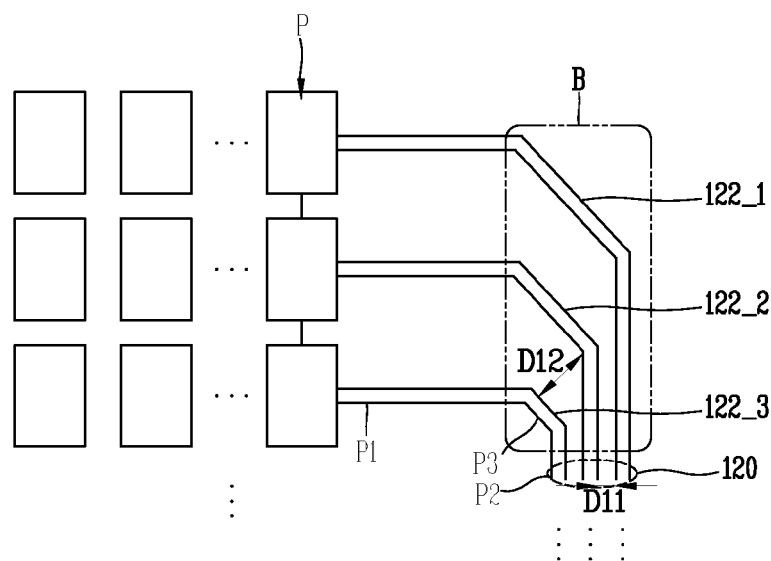
FIG. 4 is a view illustrating data link lines according to one embodiment.

FIG. 4 is a view illustrating data link lines according to an embodiment.

Referring to FIG. 4, a structure in which a plurality of link lines 122_1 to 122_3 are connected in a diagonal shape to the data lines 120 linked at ends linked thereto may be used in order to solve the foregoing problems in the related art.

The present embodiment illustrates data link lines 122_1 to 122_3 connected to the data lines 120. However, it may be applicable to gate link lines 132 connected to the gate lines 130.

The link lines 122_1 to 122_3 may include an end portion (B) connected to the data line 120, and the end portion (B) may have a horizontal portion (P1) extending from the data lines 120, a vertical portion (P2) perpendicular to the data line 120, and a diagonal portion (P3) having a diagonal shape connected between the horizontal portion (P1) and vertical portion (P2). Here, a line width of the link lines 122_1 to 122_3 may be formed in a similar manner.

Here, an electrostatic discharge protection circuit (not shown) may be provided between a plurality of unit pixels (P's) and data link lines 122_1 to 122_3, and a data voltage may be applied to the plurality of unit pixels (P's) through the electrostatic discharge protection circuit.

In the illustrated embodiment, a data link line (e.g., 122_1 to 122_3) is connected in a diagonal shape to the data line 120 at the end portion (B), and thus a propagation path may be shorter than that of the related art in which a data link line is bent in the vertical direction, thereby having an effect of preventing signal delay. In other words, a resistance based on the data link line (e.g., 122_1 to 122_3) is reduced by decreasing the length of the entire data link lines 122_1 to 122_3, thereby alleviating a signal delay problem of the data lines 120.

Furthermore, according to an embodiment of the present invention, a structure in which a plurality of link lines 122_1 to 122_3 are connected in a diagonal shape to the data lines 120 linked at ends linked thereto may be applied to reduce the non-display region (NAA) in which an image is not displayed. Accordingly, a width of bezel that is hidden by a frame or the like subsequent to the fabrication of a flat display device may be reduced, thereby having an advantage capable of implementing displays with a narrow bezel.

When the ends of the data link lines 122_1 to 122_3 that are linked to the data lines 120 are made in a diagonal shape, a gap (D11) between the data link lines in the vertical portion (P2) may be different from a gap (D12) between the data link lines in the diagonal portion (P3). If a gap between the data link lines 122_1 to 122_3 in the diagonal portion (P3) is greater than that between the data link lines 122_1 to 122_3 of the vertical portion (P2) and thus the amount exposed to etchant is greater, an over etch may be generated at the diagonal portion (P3) during the wet etching process of the data link line.

In general, the variation of an etching speed based on a density at which wirings are disposed per unit area during an etching process and a size of the wirings may be generated by a loading effect. In particular, in case of a narrow bezel in which a gap between link lines is reduced as much as possible, a bezel portion, i.e., a gap between link lines disposed in the non-display region, may be greatly reduced but a gap between the link lines of the diagonal portion may be larger when compared to the aforementioned gap, and thus an etchant is more efficiently supplied to the diagonal portion and also the discharge of residual products is more efficient subsequent to etching, thereby causing an over etch in the diagonal portion. It may be referred to as a micro loading effect. As a result, a line width of the diagonal portion (P3) may be less than that of the vertical portion (P2) subsequent to the wet etching process, although a resistance based on the data link line 122_1 to 122_3 is reduced and/or a width of bezel is reduced.

Figure 5:
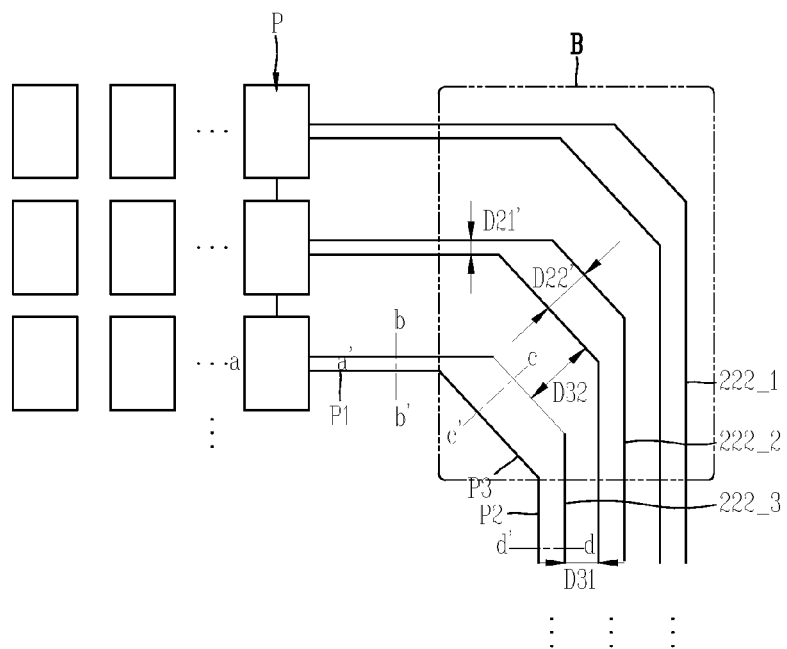
FIG. 5 is a view illustrating data link lines according to another embodiment.

Accordingly, referring to FIG. 5, according to another embodiment, a line width (D22') of the diagonal portion (P3) is formed greater than that of the vertical portion (P2).

In the illustrated embodiment, a plurality of data link lines 222_1 to 222_3 are connected to an electrostatic discharge protection circuit (not shown) on an array substrate 200 for a flat display, and the electrostatic discharge protection circuit is connected to a plurality of unit pixels (P's).

Here, the electrostatic discharge protection circuit is connected to the plurality of data link lines 222_1 to 222_3, and the electrostatic discharge protection circuit reduces a loss of data voltage due to electrostatic discharge, thereby performing a role of stably transferring the data voltage to the plurality of unit pixels (Ps).

Furthermore, according to the illustrated embodiment, the data link lines 222_1 to 222_3 may include an end portion (B) connected to the data lines, and the end portion (B) may have a horizontal portion (P1) extending from the data line, a vertical portion (P2) perpendicular to the data line 120, and a diagonal portion (P3) having a diagonal shape connected between the horizontal portion (P1) and vertical portion (P2).

In this case, the line width (D22') of the diagonal portion (P3) may be greater than the line width (D21') of the horizontal portion (P1) and the vertical portion (P2). For example, as shown in FIG. 5, the diagonal portion (P3) may be formed in a diagonal shape inclined towards the left. For example, the line width (D22') of the diagonal portion (P3) may be two times greater than the line width (D21') of the horizontal portion (P1) and the vertical portion (P2). Alternatively, the gap (D32) between the diagonal portions (P3) may be two times greater than the gap (D31) between the vertical portions (P2) in the data link lines 222_1 to 222_3. For example, when a line width (D21') of the horizontal portion (P1) and vertical portion (P2) is 3-6 μm, the line width (D22') of the diagonal portion (P3) may be formed at 6-12 μm. Alternatively, the gap (D31) between the vertical portions (P2) may be formed at 4-4.5 μm, and the gap (D32) between the diagonal portions (P3) may be formed at 8-9 μm.

The line width (D22') of the diagonal portion (P3) may be formed differently from the line width (D21') of the horizontal portion and vertical portion (P1, P2), and thus the diagonal portion (P3) may be exposed to more etchant than to the vertical portion (P2) when forming data link lines 222_1 to 222_3 through a wet etching process. As a result, the line widths (D21') of the vertical portion (P2) and diagonal portion (P3) are the same or the line width (D22') of the diagonal portion (P3) is greater than that of the vertical portion (P2) subsequent to the etching process even if an over etch is carried out, thereby further reducing a resistance based on the data link line 122_1 to 122_3 and alleviating a signal delay problem.

Moreover, in order to further avoid the micro loading effect described above, the horizontal portion (P1) may be configured to be shorter, and the line width (D22') of the diagonal portion (P3) may be wider than the line width of the vertical portion. Otherwise, the data link line may be configured that the diagonal portion of the data link line is immediately connected to a data line without providing the horizontal portion.

Hereinafter, a method of fabricating an array substrate for a flat display device including data link lines will be described with reference to FIGS. 6A through 6D.

FIGS. 6A through 6D are process cross-sectional views illustrating a method of fabricating an array substrate for a flat display device including data link lines according to another embodiment. The cross-sectional views are cut along the lines of a-a', b-b', c-c', and d-d' in FIG. 5. Here, the portion of a-a' illustrates part of the display region (AA), and the portions of b-b', c-c' and d-d' illustrate the link lines in the non-display region (NAA).

Figure 6A:
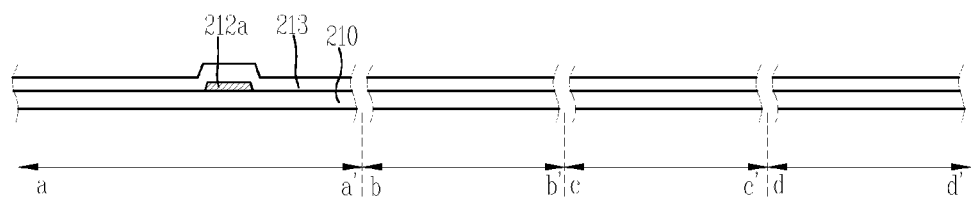
FIGS. 6A through 6D are process cross-sectional views illustrating an example method of fabricating an array substrate for a flat display device including data link lines according to another embodiment of the present invention, which are cut along the lines of a-a', b-b', c-c', and d-d' in FIG. 5.

Referring to FIG. 6A, a first metal material is deposited on the substrate 210. In this case, for example, the first metal material may be made of aluminum (Al), copper (Cu), silver (Ag), molybdenum (Mo), chromium (Cr), titanium (Ti), tantalum (Ta), or an alloy thereof.

Furthermore, the first metal material may be implemented in a multiple layer form including a double or triple or more layered multilayer structure having multiple layers with different physical properties. Here, when the first metal material may be formed in a double-layer form, one of the double layers may be made of a metal having a low electrical resistivity, for example, aluminum (or its alloy), silver (or its alloy), copper (or its alloy), or the like. In this case, the other layer may be made of a material having favourable contact characteristics with indium tin oxide (ITO), indium zinc oxide (IZO), and the like, for example, molybdenum, chromium, titanium, tantalum, or an alloy thereof.

Next, the first metal material is selectively patterned through a photolithography process to form a gate pad (not shown) and a gate electrode 212a in the display region and non-display region, respectively.

Subsequently, a gate insulating layer 213 is formed on the entire surface of the substrate 210, including the gate pad and gate electrode 212a. The gate insulating layer 213 may be made of an inorganic insulating layer such as silicon nitride (SiNx), silicon oxide (SiO2), or the like, or a high dielectric oxide layer such as hafnium oxide (HfO2), aluminum oxide, or the like.

Figure 6B:
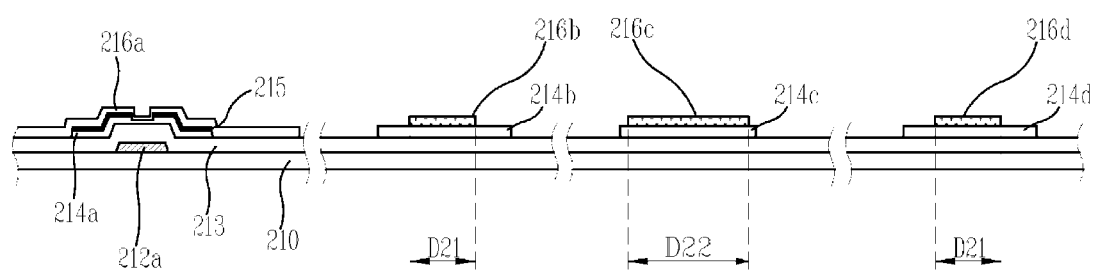
Figure 6C:
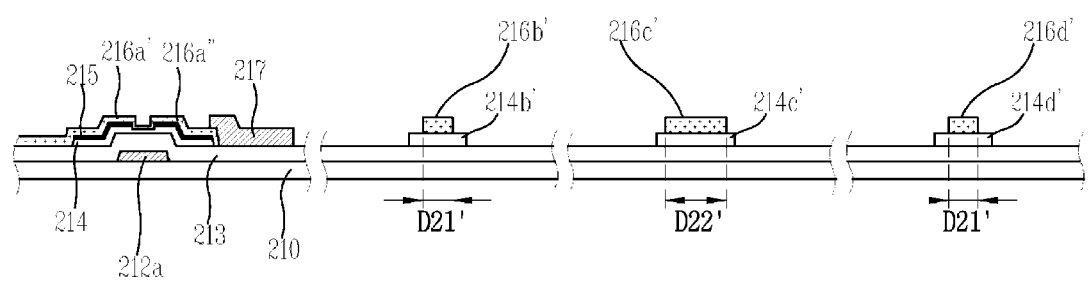

Referring to FIG. 6B, an active layer material is deposited on the gate insulating layer 213, and then the active layer material is selectively etched through a photolithography process to form an active layer 214a to 214d. The active layer 214a to 214d may be made of a semiconductor such as hydrogenated amorphous silicon or polycrystalline silicon. An ohmic contact layer 215 for making ohmic contact with the source electrode 216a' and drain electrode 216a'' (as shown in FIG. 6C) may be further formed on the active layer 214a.

Next, a second metal material 216a is formed on the active layer 214a in the display region as a conductive layer, and a first through a third pattern 216b to 216d are formed on the active layers 214b, 214c, 214d in the non-display region (NAA) using a material same as the second metal material.

The process of patterning the second metal material may be carried out through a photolithography process. During the photolithography process, as described above, a mask including patterns in which an end portion of the data link line corresponds to the horizontal portion, the vertical portion and the diagonal portion, respectively, may be used.

Referring to FIG. 6B, the line width (D22) of the second pattern 216c corresponding to the diagonal portion is formed to be wider than the line width (D21) of the first and the third pattern 216b, 216d corresponding to the horizontal portion and vertical portion. Accordingly, when wet etching is carried out during the photolithography process, even though etching is more actively carried out at the diagonal portion having a wide gap between wirings due to a micro loading effect when compared to the vertical portion having a narrow gap between wirings, the line widths of the vertical portion and diagonal portion may be the same or the line width of the diagonal portion is greater than that of the vertical portion subsequent to the etching process, thereby alleviating a signal delay problem due to link lines.

Referring to FIG. 6C, a data line, a source electrode 216a', a drain electrode 216a", and a data link line are completed through the photolithography process of the second metal layer.

The source electrode 216a' and drain electrode 216a" may be made of aluminum (Al), copper (Cu), silver (Ag), molybdenum (Mo), chromium (Cr), titanium (Ti), tantalum (Ta), or an alloy thereof. Furthermore, the source electrode 216a' and drain electrode 216a" may have a double or triple layered structure with different physical properties.

Next, a transparent conductive material is deposited on an entire surface of the array substrate 210, and then the transparent conductive material is selectively patterned through the photolithography process to form a pixel electrode 217.

Figure 6D:
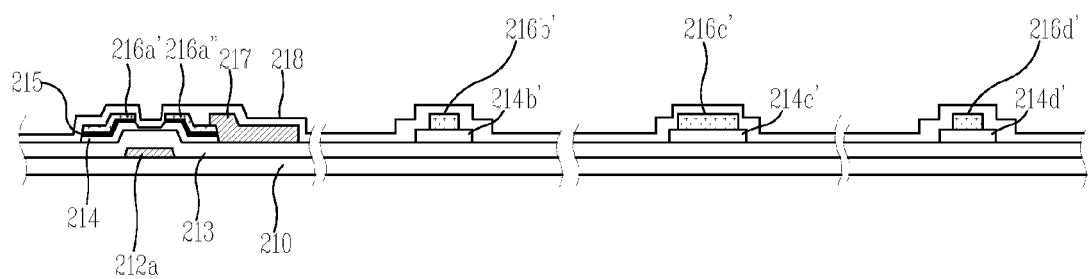

Referring to FIG. 6D, a passivation layer 218 is formed on an entire surface of the array substrate 210 including the pixel electrode 217.

Figure 7:
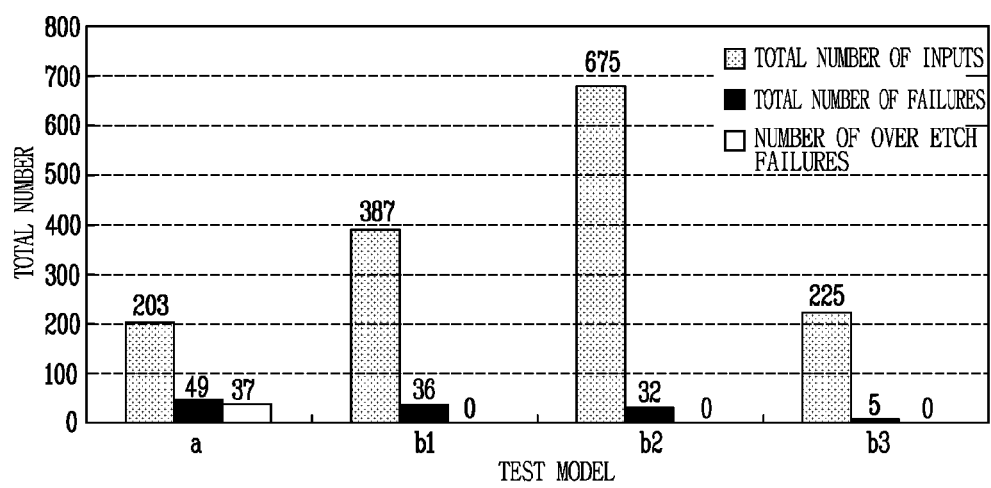
FIG. 7 is a graph illustrating the failure analysis of a flat display device according to another embodiment.

FIG. 7 is a graph illustrating the failure analysis of a flat display device according to another embodiment.

Referring to FIG. 7, "a" represents a model to which data link lines are applied in a diagonal shape to reduce a line resistance. When the total number of array substrates is 203, the total number of failed array substrates is 49, and the number of array substrates on which over etch has occurred during the data line etching process is 37.

Such a model to which data link lines are applied in a diagonal shape leads to a density difference of the pattern between a portion to which data link lines are applied in a linear shape and a portion to which data link lines are applied in a diagonal shape during a data line etching process, thereby generating a loading effect in which the etching speed varies based on the density of the pattern and the size of the pattern during the data line etching process. Due to this, an over etch may be carried out, and a disconnection of the data link line may occur, thereby a failure may occur even at thin-film transistors.

In FIG. 7, "b1" represents a model in which the line width (D22') of the diagonal portion (P3) applied in a diagonal shape is formed to be wider than the line width (D21') of the horizontal portion and vertical portion (P1, P2) applied in a linear shape to reduce the density difference of the pattern between a portion to which data link lines are applied in a linear shape and a portion to which data link lines are applied in a diagonal shape during a data line etching process. When the total number of array substrates is 387, the total number of failed array substrates is 36, and the number of array substrates on which over etch has occurred during the data line etching process is zero.

In FIG. 7, b2 and b3 represent other models similar to b1, showing the total number of failed array substrates based on the total number of array substrates, respectively. Similarly to "b1", it may be seen that the number of array substrates on which over etch has occurred during the data line etching process is zero.

Furthermore according to another embodiment of the present invention, a disconnection of data link lines may be reduced to reduce a failure rate of the flat display panel, thereby having an effect of enhancing the process yield.

Figure 8:
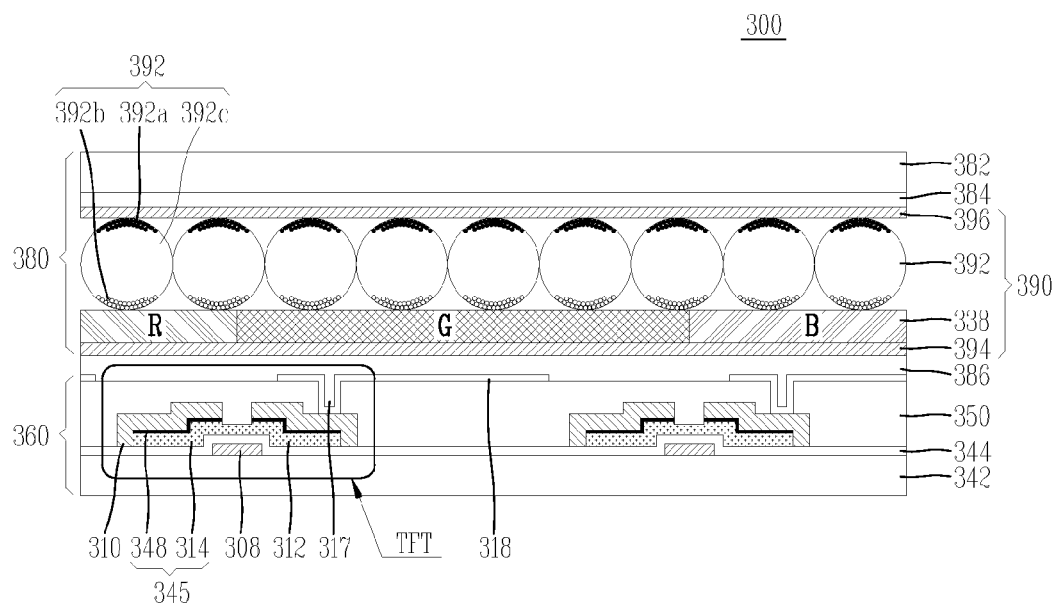
FIG. 8 is a view illustrating an electrophoretic display device according to one embodiment.

FIG. 8 is a view illustrating an electrophoretic display device according to an embodiment of the present invention.

Referring to FIG. 8, an electrophoretic display device 300 according to an embodiment of the present invention may include an array substrate 360 and an upper array substrate 380.

For the array substrate 360, a gate electrode 308 is formed on a substrate 342, and a gate insulating layer 344 is formed on the gate electrode 308. An active layer 314 is formed on the gate insulating layer 344, and an ohmic contact layer 348 for making ohmic contact to the source electrode 310 and drain electrode 312 is further formed on the active layer 314. The active layer 314 and the ohmic contact layer 348 constitute a semiconductor layer 345. A pixel electrode 318 is brought into contact with the drain electrode 312 through a contact hole 317 for exposing the drain electrode 312 through a passivation layer 350.

Meanwhile, the upper array substrate 380 disposed to face the array substrate 360 may include a common electrode 384 formed on an upper substrate 382, and an electrophoretic film 390 placed on the common electrode 384. The electrophoretic film 390 may be provided with a capsule 392 containing charge pigment particles, and an upper and a lower passivation layer 396, 394 placed at upper and lower portions of the capsule 392, respectively, and may further include a color filter 338 between the capsule 392 and the lower passivation layer 394.

The color filter 338 may include red, green and blue color filters and moreover is formed by using a thermal image method or the like. An electrophoretic display device having the foregoing configuration may include the color filter 338 to implement color. Furthermore, the upper array substrate 380 and array substrate 360 are adhered to each other by means of a laminating process using an adhesive 386.

Figure 9:
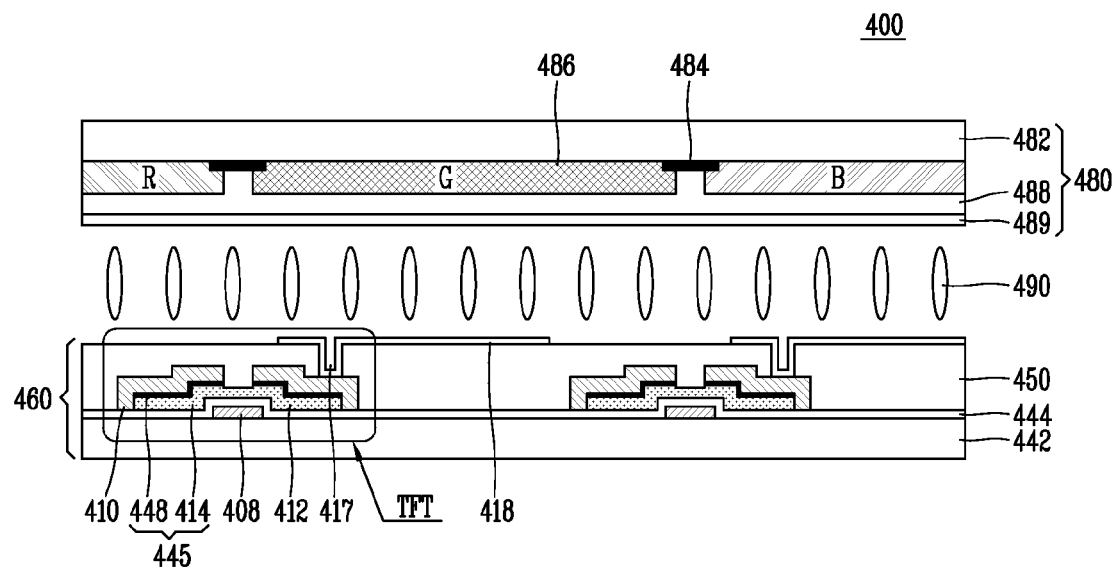
FIG. 9 is a view illustrating a liquid crystal display device according to another embodiment.

FIG. 9 is a view illustrating a liquid crystal display device according to another embodiment.

Referring to FIG. 9, a liquid crystal display device 400 according to another embodiment may include an array substrate 460, a color substrate 480, and a liquid crystal layer 490 interposed therebetween.

For the array substrate 460, a gate electrode 408 is formed on a substrate 442, and a gate insulating layer 444 is formed on the gate electrode 408. An active layer 414 is formed on the gate insulating layer 444, and an ohmic contact layer 448 for making ohmic contact to the source electrode 410 and drain electrode 412 is further formed on the active layer 414. The active layer 414 and the ohmic contact layer 448 constitute a semiconductor layer 445. A pixel electrode 418 is brought into contact with the drain electrode 412 through a contact hole 417 for exposing the drain electrode 412 through a passivation layer 450.

Meanwhile, the color substrate 480 disposed to face the array substrate 460 may include an upper substrate 482, a black matrix 484, a color filter 486 placed between the black matrices 484, an overcoat layer 488 configured to cover the black matrix 484 and color filter 486, and a common electrode 489 placed on the overcoat layer. Furthermore, a liquid crystal layer 490 may be placed between the forgoing array substrate 460 and color substrate 480 adhered to each other.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. An array substrate for a flat display device, the array substrate comprising:
    a substrate comprising a display region and a non-display region disposed at an edge of the display region;
    a plurality of gate lines disposed in the display region and a plurality of data lines vertically crossed with the plurality of gate lines; and
    a plurality of gate link lines configured to apply gate signals to the plurality of gate lines and a plurality of data link lines configured to apply data signals to the plurality of data lines,
    wherein at least the outermost data link line of the plurality of data link lines comprises an end portion, the end portion connected to a corresponding data line of the plurality of data lines, and wherein the outermost data link line is the data link line closest to the outermost edge of the non-display region;
    wherein the end portion comprises a horizontal portion extending from the corresponding data line, a vertical portion perpendicular to the corresponding data line, and a diagonal portion having a diagonal shape connected between the horizontal portion and the vertical portion,
    wherein a line width of the diagonal portion is greater than a line width of the horizontal portion or vertical portion.

2. The array substrate of claim 1, wherein each of the plurality of data link lines comprises the end portion, and a gap between the diagonal portions have a same width as a width of a gap between the vertical portions.

3. The array substrate of claim 1, wherein a line width of the diagonal portion is same as a line width of the vertical portion.

4. The array substrate of claim 1, wherein a gap between the diagonal portions has a same width as a width of a gap between the vertical portions.

5. The array substrate of claim 1, wherein a gap between the diagonal portions is greater than a width of a gap between the vertical portions in the plurality of data link lines.

6. The array substrate of claim 1, further comprising:
    a gate electrode formed on the substrate;
    a gate insulating layer formed on the gate electrode;
    a semiconductor layer formed on the gate insulating layer;
    a source electrode and a drain electrode formed on the semiconductor layer; and
    a pixel electrode brought into contact with the drain electrode.

7. The array substrate of claim 1, wherein the flat display device is an electrophoretic display device.

8. The array substrate of claim 1, wherein the flat display device is a liquid crystal display device.

9. The array substrate of claim 1, wherein an electrostatic discharge protection circuit is provided between the plurality of data link lines and the plurality of data lines.

* * * * *